US005577071A

United States Patent [19]

Gehrke et al.

[11] Patent Number: 5,577,071
[45] Date of Patent: Nov. 19, 1996

[54] METHOD FOR AND APPARATUS TO EXTRACT A FREQUENCY REFERENCE, A TIME REFERENCE AND DATA FROM A SINGLE INFORMATION SYSTEM

[75] Inventors: James K. Gehrke, Lake in the Hills; Mark G. Spiotta, Wheaton, both of Ill.

[73] Assignee: Motorola, Inc., Schaumburg, Ill.

[21] Appl. No.: 201,586

[22] Filed: Feb. 25, 1994

[51] Int. Cl.⁶ .............................. H04L 27/00; H04L 7/00; H03K 7/08; H03K 9/08
[52] U.S. Cl. .................... 375/259; 375/238; 375/356; 375/295; 375/316; 455/56.1
[58] Field of Search .................................. 375/238, 257, 375/259, 295, 302, 316, 322, 354, 272, 303, 334, 269, 356; 455/56.1, 102; 341/53; 327/31, 26

[56] References Cited

U.S. PATENT DOCUMENTS 4,897,854  1/1990  Harris et al. ............................ 375/238
5,055,845  10/1991  Ridkosil .................................. 341/155
5,088,111  2/1992  McNamara et al. .................... 375/269
5,140,611  8/1992  Jones et al. ............................. 375/238

Primary Examiner—Tesfaldet Bocure
Attorney, Agent, or Firm—Christopher P. Moreno

[57] ABSTRACT

A frequency reference, a time reference and data may be provided on, and subsequently extracted from, a single information stream. To achieve this a modulator 102 generates the single information stream by modulating the data on the frequency reference and pre-empting the data modulation to modulate the time reference on the frequency reference. This single information stream is then provided on a single bus 106 which is coupled to a plurality of base stations 103–105. The base stations 103–105 each include a demodulator 107–109, which recovers the frequency reference 117, the time reference 118, and/or the data 116, from the single information stream.

13 Claims, 3 Drawing Sheets

METHOD FOR AND APPARATUS TO EXTRACT A FREQUENCY REFERENCE, A TIME REFERENCE AND DATA FROM A SINGLE INFORMATION SYSTEM

FIELD OF THE INVENTION

This invention relates generally to communication systems, and, in particular, to providing and extracting signal references.

BACKGROUND OF THE INVENTION

Communication systems are well known in the art. Generally, a communication system comprises a plurality of communication units, a communications resource controller and a pool of communication resources. In normal operation, the controller receives a service request from a communication unit, determines availability of communication channels and allocates, when available, a communication channel to the communication unit. For wide area communications, multiple sites are located throughout the area of coverage and linked to provide seamless communication between sites to a plurality of communication units. A multi-site system has common system parameters which are provided to the base stations at every site, such as operating frequencies and a system clock. The base stations may also be provided with a data link to communicate status information or data. Hence, in a multi-site system, all base stations are provided with three links, one for a frequency reference to generate the operating frequencies, another for a time reference to provide the system clock, and/or a third data.

A base station can generate operating frequencies using an integrated frequency generator, however, as frequency generators use frequency sensitive components, such as crystal oscillators, the generated operating frequencies may vary with ambient conditions. For example, base stations at different sites may be subjected to significantly different ambient temperatures that may result in substantial misalignment between the operating frequencies of the base stations. Consequently, when using affected base stations, communications may be degraded. In order to prevent misalignment, the frequency reference is provided to the base stations, limiting any variation of operating frequencies through out the system. Typically, the frequency reference is a 5 megahertz signal provided by a high stability reference frequency generator.

The time reference is provided to the base station to synchronize communication in the system, particularly when simulcasting digital information or when transferring data between communication sites. Typically, the time reference is allowed a maximum error of approximately one microsecond.

The data link is provided to the base stations to enable control equipment, such as a site controller, to determine the operating status of the base stations at a site, or to direct the base stations to execute self diagnostics tests and provide the results to the site controller.

At each site, separate co-axial cables may be used to distribute the frequency reference and the time reference, and a RS-232 cable may be used to provide the data, to the base stations. As a result, at each site, a substantial amount of cable is used requiring longer installation time for new sites, causing lower reliability due to the multiple connections, and providing a greater probability of radio frequency interference (RFI) attributed to the numerous lengths of cable carrying different signals.

Presently, a method of distribution used by the National Bureau of Standards on their WWV and WWVH channels, provides the frequency reference, the time reference and data in a single data stream signal. This is achieved by formatting the frequency reference, time reference and data into frames of one minute duration, and transmitting the frames at an effective data rate of one bit per second. A first bit provides a start-of-frame indication and the 59 bits that follow are pulse width modulated with data. This method can provide a frequency reference of one hertz with each bit, a time reference with the start-of-frame each minute, and data comprising 59 bits of information per minute. At the site of a radio communication system, however, this method imposes severe limitations. Firstly, data transfer only occurs at regular one minute intervals producing a slow data transfer rate. Secondly, the whole data frame incorporating the three pieces of information, has to be received and decoded to obtain any one of the three pieces of information. The design of such a decoder is relatively complex and may not be economical as each base station has to be equipped with the decoder irrespective of the base station requirements. For example, a first base station requiring only one piece of information is provided the same decoder as a second base station requiring all three pieces of information. In addition, this method is not backwards compatible with earlier base station designs that only require the frequency reference.

Accordingly, a need exists for a method that allows a frequency reference, a time reference and data to be individually extracted from a single data stream.

DESCRIPTION OF A PREFERRED EMBODIMENT

Generally, the present invention provides a method and apparatus for providing on, and extracting from, a single information stream, a frequency reference, a time reference and data. This is accomplished by a reference distribution system that modulates the time reference and data on the frequency reference to produce the single information stream. This single information stream is then routed over a single cable to a plurality of base stations. Each base station is capable of extracting one, two or all three pieces of information contained in the single information stream. With such a method and apparatus, a single conductor can convey the frequency reference, time reference, and data to a plurality of base stations, and each base station can retrieve these signals individually which was not achievable in prior art systems.

Figure 1:
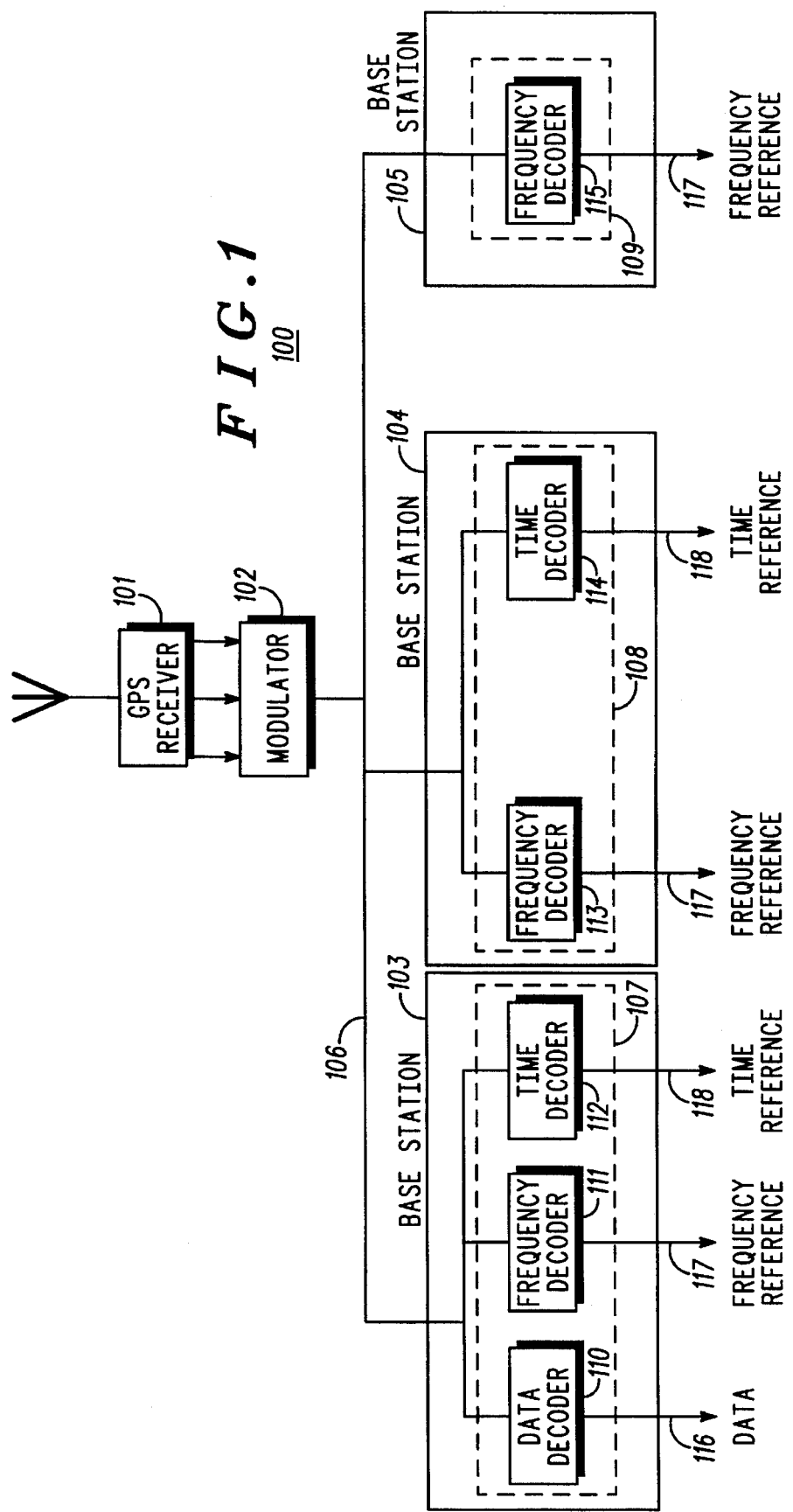
FIG. 1 illustrates a block diagram of a radio communications system in accordance with the present invention.

The present invention can be more fully described with reference to FIGS. 1–4. FIG. 1 illustrates a communication system 100 that includes a Global Positioning System (GPS) receiver 101, a modulator 102, and a plurality of base stations 103–105. The base stations are coupled to the modulator 102 via a single bus 106 and include a demodulator 107–109. The demodulators 107–109 may include frequency reference decoders 111,113,115, time reference decoders 112 and 114, and data decoders 110. Dependent upon the requirements of each base station 103–105, the demodulators 107–109 provide a different number of decoders. For example, base station 103 is provided with 3 decoders 110–112 to extract data, the frequency reference and the time reference respectively, while base station 105 is provided with one decoder 115 to extract the frequency reference. The data and time decoders 110,112 and 118 are digital pulse width demodulators made up of digital circuitry comprising logic gates, a counter and a 40 MHz clock. The frequency decoder 111, 113 and 115 is a digital rising edge detector made up of digital circuitry comprising edge triggered logic gates.

Figure 2:
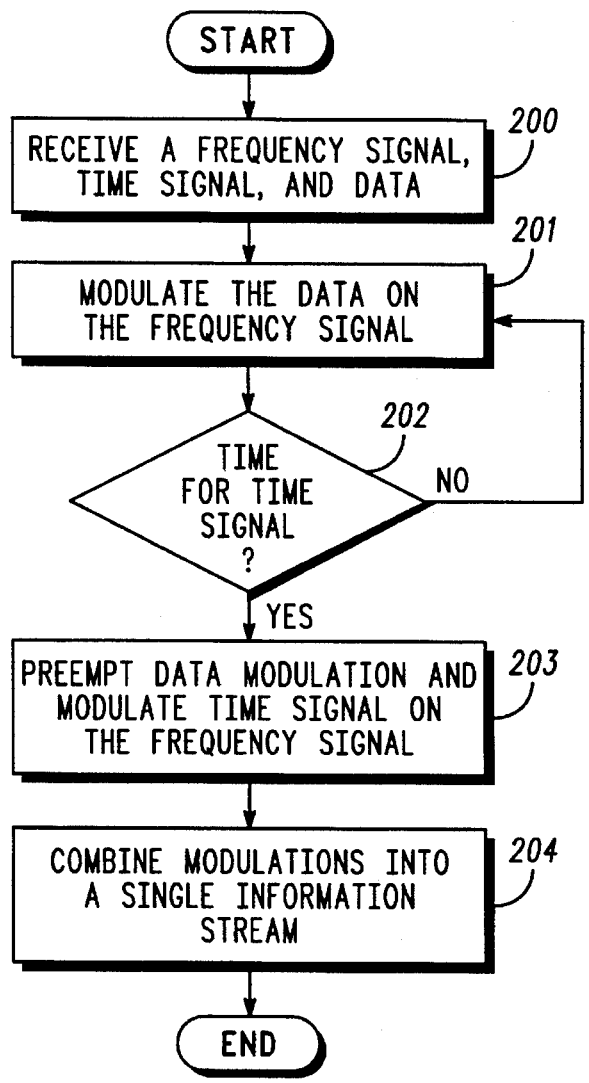
FIG. 2 illustrates a logic diagram detailing the operation of a modulator in accordance with the present invention.

FIG. 2 illustrates a logic diagram that the modulator 102 may incorporate to generate the single information stream. At step 200, the modulator receives a frequency signal, a time signal and data from the GPS receiver. Upon receiving the information, the modulator modulates the data on the frequency reference signal 201. While modulating the data 201, the modulator determines whether it is time to transmit the time reference signal 202. If it is not time 202, the modulator continues to modulate the data 201. If, however, it is time 202, the modulator pre-empts the data modulation to modulate the time reference signal on the frequency reference signal 203. Once this is completed, the modulated data and time reference signal are combined into a single information stream 204.

As an example assume the frequency reference signal is 5 megahertz, and the time reference is received once every second. Thus, when the time reference is received, one of the 5 million cycles is used to encode the time reference and all other cycles are used to modulate data. Note that the modulation may be done in a variety of techniques, such as amplitude modulation, phase modulation or a combination of these modulation schemes. For example, the time reference state may be amplitude modulated and the data states may be pulse width modulated. For a pulse width modulator, three states of pulse width modulation representing data 0, data 1 and time reference, encode the data and the time reference. Typically, a 12.5% duty cycle represents the data 0 state, a 50% duty cycle represents the data 1 state and a 87.5% duty cycle represents the time reference state.

Figure 3:
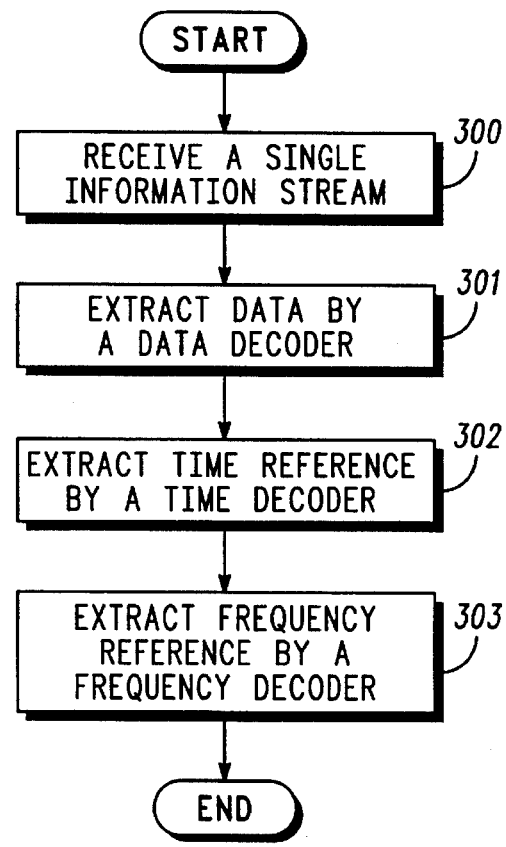
FIG. 3 illustrates a logic diagram detailing the operation of a demodulator in accordance with the present invention.

FIG. 3 illustrates a logic diagram that the demodulator at a base station may use to extract the time reference, the frequency reference, and/or data from the single information Stream. At step 300, the demodulator receives the single information stream, via a single bus, and provides the single information stream to at least one decoder. A particular type of decoder is required to extract a particular type of information, and the number of decoders provided in the demodulator is determined by the requirements of the base station. For example, base stations supporting analog systems may only require a frequency decoder while base stations supporting digital simulcast systems may require a frequency, a time and a data decoder. In the case of a base station having all three decoders, the data decoder extracts the data from the single information stream 301, the time decoder extracts the time reference 302 and, the frequency decoder extracts the frequency reference 303. If the base station has fewer than all three decoders, only the appropriate steps are executed. For example, if the base station has only a frequency decoder, only steps 300 and 303 are performed.

The data decoder detects data states 0 and 1 by determining the width of a pulse. Such a determination may be made by a 40 megahertz clock driving a counter that counts the number of clock cycles that occur while the pulse is active. Each cycle of the 40 megahertz clock has a resolution of 25 nanoseconds, hence the count provided by the counter determines the width of the pulse and indicates the data state. A count of 2 or less indicates data state 0, and a count of 3 to 5, indicates data state 1. The time decoder also detects the time reference by determining pulse width of a pulse width signal and uses the same detection scheme as the data decoder, however, a count of 6 or more indicates the time reference state. In addition, when the counter indicates the count of 6 or more, no output is provided by the data decoder. The frequency decoder uses the rising edge of each pulse to detect the frequency reference, which is used by a base station synthesizer to lock to the rising edge of the frequency reference thereby controlling the transmitter frequency output.

Figure 4:
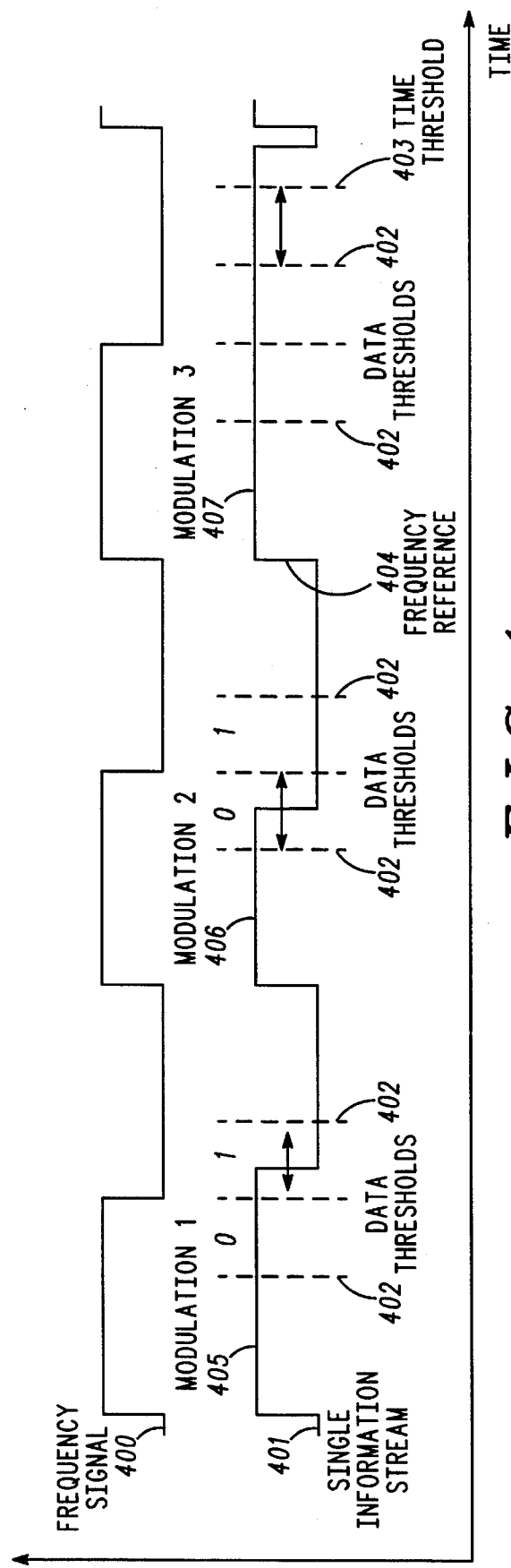
FIG. 4 depicts a timing diagram in accordance with the present invention.

FIG. 4 illustrates a timing diagram of the extraction process. Pulses of a single information stream 401 can have one of three modulation states. When using pulse width modulation, the modulation state of a pulse is determined by the time a pulse is high. A pulse 405 in a first modulation state represents data as a logic 1 when the trailing edge of the pulse 405 falls between the data thresholds 402, (for example, between 75 and 125 nanoseconds). Similarly, a pulse 406 in a second modulation state represents data as a logic 0 when the trailing edge of the pulse 406 falls between the data thresholds 402, (for example 50 nanoseconds or less). Further, a pulse 407 in a third modulation state represents the time reference when the trailing edge of the pulse 406 falls between the time threshold 403, (for example 150 nanoseconds or greater). Using the method described above, a data decoder using the data thresholds 402 can detect the data 1 and data 0 modulation states and extract the data from the single information stream. Likewise, a time decoder using the time threshold 403 can detect the time reference modulation state and extract the time reference. The frequency reference 404 is extracted, by the frequency decoder, from the single information stream by detecting the rising edge of each pulse. Using this method the position of the rising edge of the pulse train is not altered by either of the three modulation states and provides backward compatibility with existing equipment that require the frequency reference.

In the quickly evolving environment of radio communication systems, high accuracy frequency and time references are required by base station transmitters. This design approach enables many different types of base stations to utilize a single frequency reference, time reference and data, distribution system that is backward compatible with existing equipment. As a result, the simplified distribution network significantly reduces site costs and improves radio frequency interference (RFI) performance while increasing overall system reliability.

We claim:

1. A method for extracting a frequency reference, a time reference, and data from a single information stream, the method comprising the steps of:

a) receiving the single information stream;

b) extracting, by a frequency decoder, the frequency reference from the single information stream independent from the time reference and the data;

c) extracting, by a time decoder, the time reference from the single information stream independent from the frequency reference and the data; and d) extracting, by a data decoder, the data from the single information stream independent from the frequency reference and the time reference.

2. The method of claim 1, step (c) further comprising extracting the time reference by determining that a modulation of the single information stream is within a predetermined threshold.

3. The method of claim 2, step (c) further comprising determining that the modulation of the information stream is within a predetermined time threshold.

4. The method of claim 1, step (d) further comprising extracting the data by demodulating the single information stream.

5. The method of claim 4, step (d) further comprising pulse width demodulating a modulation of the single information stream.

6. A method for providing a frequency reference, a time reference, and data in a single information stream, the method comprising the steps of:

a) receiving a frequency signal, a time signal, and a data stream;

b) modulating the data stream on the frequency signal, wherein modulation of the data stream is within predetermined data thresholds; and c) preempting the modulation of the data stream on the frequency signal when modulating the time signal on the frequency signal, wherein modulation of the time signal is within a predetermined time threshold.

7. The method of claim 6, step (b) further comprising pulse width modulating the data stream on the frequency signal.

8. The method of claim 6, further comprising the step of extracting the data from the single information stream using a data decoder.

9. The method of claim 6, further comprising the step of extracting the frequency reference from the single information stream using a frequency decoder.

10. The method of claim 6, further comprising the step of extracting the time reference from the single information stream using a time decoder.

11. A reference system comprising:

a receiver that receives a frequency reference signal, a time reference signal and data;

a modulator operably coupled to the receiver, wherein the modulator modulates the frequency reference signal, the time reference signal and data into a single information stream;

a plurality of demodulators coupled via a single bus to the modulator wherein each of the demodulators extract at least one of the frequency reference signal, the time reference signal and the data from the single information stream, wherein each of the frequency reference signal, the time reference signal and the data are extracted independently from each other by a respective one of the plurality of demodulators.

12. The reference system of claim 11, the modulator further comprising a pulse width modulator.

13. The reference system of claim 11, the single bus further comprising a coaxial cable.

* * * * *

UNITED STATES PATENT AND TRADEMARK OFFICE
CERTIFICATE OF CORRECTION

PATENT NO. : 5,577,071
DATED : November 19, 1996
INVENTOR(S) : James K. Gehrke, Mark G. Spiotta It is certified that error appears in the above-indentified patent and that said Letters Patent is hereby corrected as shown below:

Title page, item [54] and column 1,
In the title, "system" should be --stream--.

Signed and Sealed this

Eighth Day of April, 1997

Attest:

BRUCE LEHMAN

Attesting Officer

Commissioner of Patents and Trademarks